(12) United States Patent
Chartier et al.

(10) Patent No.: US 9,303,331 B2
(45) Date of Patent: Apr. 5, 2016

(54) HEATER ASSEMBLY FOR CRYSTAL GROWTH APPARATUS

(75) Inventors: Carl Chartier, Manchester, NH (US); Parthasarathy Santhanaraghavan, Nashua, NH (US); Andriy Andrukhiv, Hollis, NH (US); Dave Lackey, Merrimack, NH (US); Bhuvaragasamy G. Ravi, Nashua, NH (US)

(73) Assignee: GTAT Corporation

( * ) Notice: Subject to any disclaimer, the term of this patent is extended or adjusted under 35 U.S.C. 154(b) by 849 days.

(21) Appl. No.: 13/489,675

(22) Filed: Jun. 6, 2012

(65) Prior Publication Data

US 2012/0312800 A1    Dec. 13, 2012

Related U.S. Application Data

(60) Provisional application No. 61/493,804, filed on Jun. 6, 2011.

(51) Int. Cl.
*F27D 11/00* (2006.01)
*C30B 11/00* (2006.01)
(Continued)

(52) U.S. Cl.
CPC ............. *C30B 11/003* (2013.01); *C30B 15/14* (2013.01); *F27B 14/14* (2013.01); *F27D 11/02* (2013.01); *F27D 99/0006* (2013.01)

(58) Field of Classification Search
CPC ...... C30B 11/003; C30B 29/06; C30B 15/00; C30B 15/14; C30B 15/18; C30B 11/002; F27D 99/0006; F27D 11/00; F27B 14/14; Y10T 117/1016

USPC .............. 219/385, 395, 420, 422, 424, 426; 117/200, 204, 217
See application file for complete search history.

(56) References Cited

U.S. PATENT DOCUMENTS 4,761,528 A * 8/1988 Caillaut et al. ............... 219/628
6,285,011 B1 * 9/2001 Cherko ......................... 219/426
(Continued)

FOREIGN PATENT DOCUMENTS

JP     09-235175 A     9/1997
JP     H09-235178 A    9/1997
(Continued)

OTHER PUBLICATIONS

International Search Report mailed Jan. 23, 2013 in connection with PCT/US2012/035970.
(Continued)

*Primary Examiner* — Dana Ross
*Assistant Examiner* — Lindsey C Teaters
(74) *Attorney, Agent, or Firm* — Parker Ibrahim & Berg LLC; Stephen D. LeBarron

(57) ABSTRACT

Systems and methods are provided to promote uniform thermal environment to feedstock material (e.g., silicon) in a crucible of a crystal growth apparatus are provided herein. More specifically, a heating system may be arranged in the crystal growth apparatus so as to include at least a first and second heating element which are configured to distribute heat axisymmetrically to the feedstock material and the second heating element that is configured to distribute heat symmetrically to the feedstock material to thereby provide uniform heat distribution to the feedstock material in the crucible to allow for increased consistency in crystal ingot quality.

10 Claims, 5 Drawing Sheets

(51) Int. Cl.
*C30B 35/00* (2006.01)
*C30B 15/14* (2006.01)
*F27B 14/14* (2006.01)
*F27D 11/02* (2006.01)
*F27D 99/00* (2010.01)

(56) References Cited

U.S. PATENT DOCUMENTS

| | | | |
|---|---|---|---|
| 6,652,649 | B1 | 11/2003 | Hearst et al. |
| 2005/0061804 | A1 | 3/2005 | Golm |
| 2007/0266931 | A1 | 11/2007 | Mueller et al. |
| 2011/0158887 | A1* | 6/2011 | Stoddard ............... C30B 11/001 423/348 |

FOREIGN PATENT DOCUMENTS

| | | |
|---|---|---|
| JP | H10-167876 A | 6/1998 |
| JP | 2001-226191 A | 8/2001 |
| JP | 2005-053722 A | 3/2005 |
| JP | 2009-292673 A | 12/2009 |
| WO | WO-02/27076 A1 | 4/2002 |
| WO | WO-2009-117545 A1 | 9/2009 |

OTHER PUBLICATIONS

Office Action issued Sep. 2, 2015 in connection with Japanese Application No. 2014-514457.
Office Action issued Sep. 15, 2015 in connection with Chinese Application No. 201280034180.4.

* cited by examiner

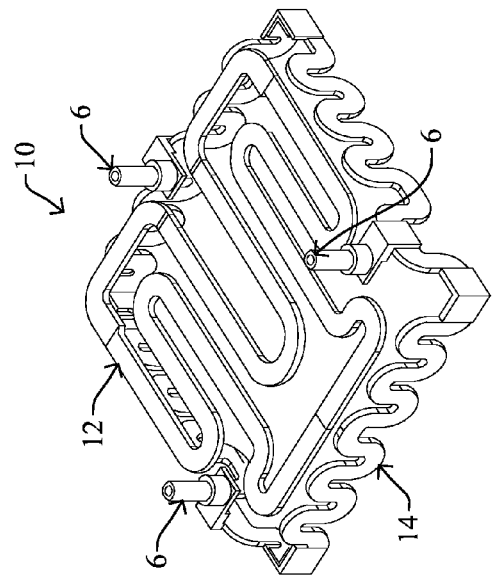
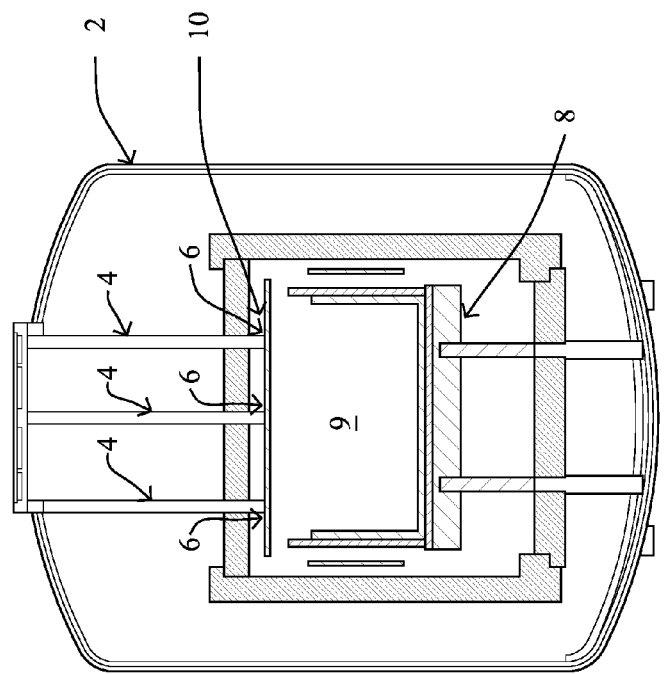
FIG. 1
FIG. 2

HEATER ASSEMBLY FOR CRYSTAL GROWTH APPARATUS

RELATED APPLICATIONS

This application claims the benefit of U.S. Provisional Application No. 61/493,804, filed Jun. 6, 2011 the entire contents of which is expressly incorporated herein by reference.

FIELD OF THE INVENTION

The present invention relates to a crystal growth apparatus which provides uniform heat distribution to feedstock material in a crucible.

BACKGROUND OF THE INVENTION

Crystal growth apparatuses or furnaces, such as directional solidification systems (DSS) and heat exchanger method (HEM) furnaces, involve the melting and controlled resolidification of a feedstock material, such as silicon, in a crucible to produce an ingot. Production of a solidified ingot from molten feedstock occurs in several identifiable steps over many hours. For example, to produce a silicon ingot by the DSS method, solid silicon feedstock is provided in a crucible, often contained in a graphite crucible box, and placed into the hot zone of a DSS furnace. The feedstock charge is then heated using various heating elements within the hot zone to form a liquid feedstock melt, and the furnace temperature, which is well above the silicon melting temperature of 1412° C., is maintained for several hours to ensure complete melting. Once fully melted, heat is removed from the melted feedstock, often by applying a temperature gradient in the hot zone, in order to directionally solidify the melt and form a silicon ingot. By controlling how the melt solidifies, an ingot having greater purity than the starting feedstock material can be achieved, which can then be used in a variety of high end applications, such as in the semiconductor and photovoltaic industries.

The heating element used in the hot zone of a DSS furnace can be either resistive or inductive. In induction-type heating, typically a water-cooled heating coil surrounds the silicon feedstock material, and the current flowing through the coil is coupled to a susceptor or the feedstock material to achieve appropriate heating of the feedstock material. In the case of resistance heating, current flows through a resistive element which heats up, and the heating element can be designed with a particular material, resistivity, shape, thickness, and/or current path to meet operating temperature and power requirements. In silicon ingot production by directional solidification, resistance-type heating systems typically are used.

DSS furnaces are particularly useful for crystal growth and directional solidification of silicon ingots used in photovoltaic (PV) applications as well as for to semiconductor applications. For either type of application, it is desirable to produce large silicon ingots to lower average production costs. However, as larger ingots are produced, it becomes increasingly difficult to control heat flow and distribution throughout the furnace hot zone in order to achieve substantially controlled heating and heat extraction during production of the ingot. If heat flow and distribution are not substantially controlled throughout the process, the quality of the ingot may suffer.

In practice, as the cross-sectional area of ingots becomes larger, furnaces are sometimes designed with multiple heating elements in an effort to better control the distribution and flow of heat and the temperature gradient in different zones. For example, commonly owned U.S. patent application Ser. No. 12/933,300 describes, in part, a DSS furnace comprising a heating system having two heating elements—an asymmetric serpentine-patterned top heating element which distributes heat downward toward the surface of a feedstock-filled crucible and an asymmetric serpentine-patterned side heater which distributes heat inwardly toward the sides of the crucible. Both the first heating element and the second heating element effectively heat, melt, and solidify the feedstock charged in the crucible. However, both distribute heat asymmetrically to the crucible, resulting in a non-uniform heat/temperature distribution that can result in variability in the quality of the resulting crystalline ingots.

While dual heating elements can be used to form larger ingots, the use of multiple components adds to the complexity of the solidification system and makes it difficult to control heat flow and distribution precisely, especially in a production environment. It is desirable, particularly in applications for growing large ingots, to provide multiple heating elements that are capable of achieving substantially even heating of the entire feedstock material contained in the crucible and adequately control heat flow and distribution throughout the furnace hot zone. Therefore, it would be desirable to design a heating system which could provide uniform heat distribution to the feedstock-containing crucible to thereby provide for more consistent crystal quality.

SUMMARY OF THE INVENTION

Systems and methods to promote uniform heat/temperature distribution to to feedstock material (e.g., silicon) in a crucible of a crystal growth apparatus are provided herein. More specifically, a heating system is arranged in the crystal growth apparatus so as to include at least a first and second heating element. The first heating element is configured to distribute heat axisymmetrically to the feedstock material and the second heating element is configured to distribute heat symmetrically to the feedstock material. This combination provides uniform heat distribution to the feedstock material in the crucible to allow for increased consistency in crystal quality.

Furthermore, in the exemplary illustrative embodiment of the present invention, the first (e.g., top) heating element may be formed in a circular shape and made out of a single continuous part or material so as to form a circular shape circumferentially. As a preferable mode of providing uniform heat to the top of the feedstock material, the first heating element may be arranged above the crucible in the crystal growth apparatus. Likewise, as a mode for providing uniform heat along sides of the feedstock material, the second heating element may be formed in a geometrically and/or electrically symmetrical serpentine shape and arranged along sides of the crucible in the crystal growth apparatus.

Other aspects and embodiments of the invention are discussed below.

BRIEF DESCRIPTION OF THE DRAWINGS

For a better understanding of the nature and desired objects of the present invention, reference is made to the following detailed description taken in conjunction with the accompanying drawing figures wherein like reference character denote corresponding parts throughout the several views and wherein:

FIG. 1 is a cross-sectional front view of a conventional crystal growth apparatus;

FIG. 2 is a perspective view of a previously designed heating system for use in the crystal growth apparatus shown in FIG. 1;

DEFINITIONS

Figure 3:
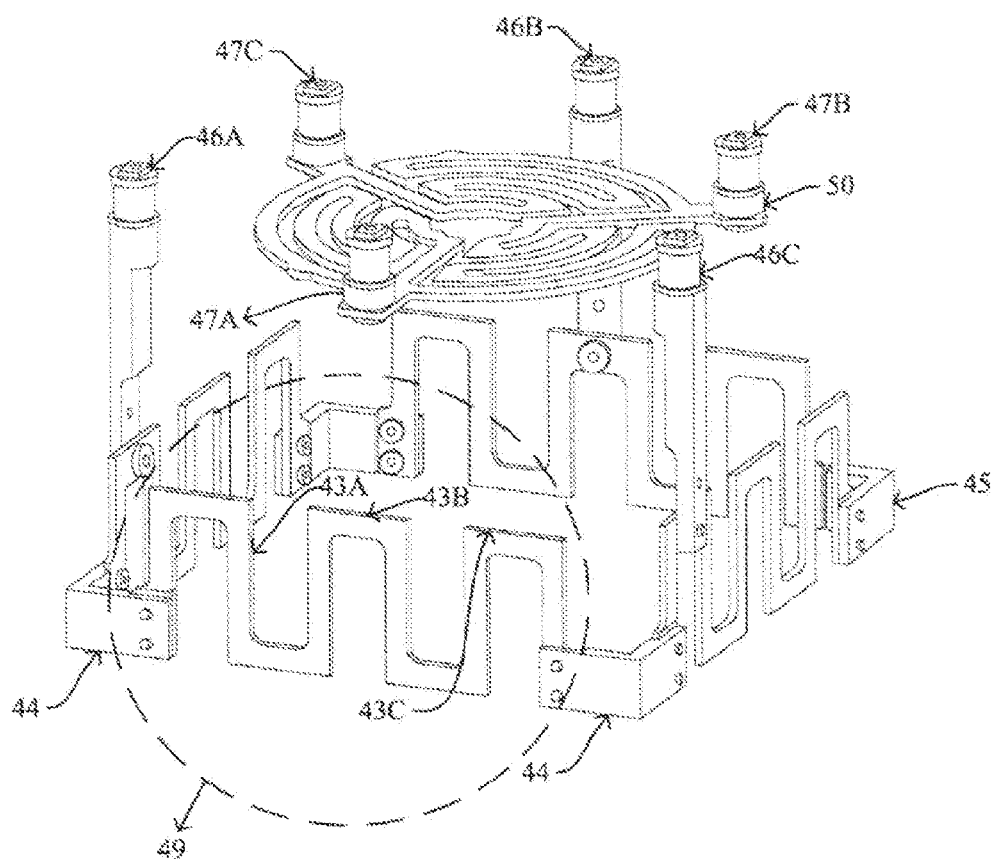
FIG. 3 is a perspective view of a heating system according to an exemplary embodiment of the present invention.

The instant invention is most clearly understood with reference to the following definitions:

As used in the specification and claims, the singular form "a," "an" and "the" include plural references unless the context clearly dictates otherwise.

A "furnace" or "crystal growth apparatus" as described herein refers to any device or apparatus capable of heating and melting a solid feedstock, such as silicon, at temperatures generally greater than about 1000° C. and subsequently promoting resolidification of the resulting melted feedstock material to form a crystalline material, such as a silicon ingot for photovoltaic (PV) and/or semiconductor applications.

"Symmetric" and "axisymmetric" heat distribution as described herein are understood to mean substantially symmetric and axisymmetric, respectively. This is due to often uncontrollable circumstances that one skilled in the art would understand could affect actual heat distribution so that it is not always perfectly symmetric or axisymmetric, especially over extended periods of time.

DETAILED DESCRIPTION OF THE INVENTION

The crystal growth apparatus of the present invention may be a furnace, in particular a high-temperature furnace, capable of heating and melting solid feedstock material, such as silicon or alumina, at temperatures generally greater than about 1000° C. and subsequently promoting resolidification of the resulting melted feedstock material to form a crystalline material, such as a multicrystalline silicon ingot or a to sapphire boule. For example, the crystal growth apparatus can be a crystal growth furnace, including a directional solidification system (DSS) furnace or a heat exchanger method (HEM) furnace.

The crystal growth apparatus of the present invention has a outer furnace chamber or shell (such as a water-cooled outer shell) and an interior hot zone within the furnace shell that is used to heat and melt the feedstock material and subsequently to promote resolidification of the melted feedstock material to form a crystalline material. The furnace shell can be any known structure used in the art for high temperature crystallization furnaces, including a stainless steel shell comprising an outer wall and an inner wall defining a cooling channel for circulation of a cooling fluid, such as water.

The hot zone of the crystal growth apparatus is an interior region within the furnace shell in which heat can be provided and controlled to melt and resolidify a feedstock material. The hot zone is surrounded by and defined by insulation, which can be any material known in the art that possesses low thermal conductivity and is capable of withstanding the temperatures and conditions in a high temperature crystal growth furnace. For example, the hot zone can be surrounded by insulation of graphite. The shape and dimension of the hot zone can be formed by a plurality of insulation panels which can either be stationary or mobile. For example, the hot zone may be formed of top, side, and bottom insulation panels, with the top and side insulation panels configured to move vertically relative to a crucible placed within the hot zone.

The hot zone further includes a crucible, optionally within a crucible box, atop a crucible support block. The crucible can be made of various heat resistant materials, for example, quartz (silica), graphite, molybdenum, silicon carbide, silicon nitride, composites of silicon carbon or silicon nitride with silica, pyrollitic boron nitride, alumina, or zirconia and, optionally, may be coated, such as with silicon nitride, to prevent cracking of the ingot after solidification. The crucible can also have a variety of different shapes having at least one side and a bottom, including, for example, cylindrical, cubic or cuboid (having a square cross-section), or tapered. Preferably, when the feedstock is silicon, the crucible is made of silica and has a cube or cuboid to shape.

The crucible can optionally be contained within a crucible box, which provides support and rigidity for the sides and bottom of the crucible and is particularly preferred for crucibles made of materials that are either prone to damage, cracking, or softening, especially when heated. For example, a crucible box is preferred for a silica crucible but may be unnecessary for a crucible made of silicon carbide, silicon nitride, or composites of silicon carbide or silicon nitride with silica. The crucible box can be made of various heat resistant materials, such as graphite, and typically has at least one side plate and a bottom plate, optionally further including a lid. For example, for a cube or cuboid-shaped crucible, the crucible box is preferably also in the shape of a cube or cuboid, having four walls and a bottom plate, with an optional lid.

The crucible and optional crucible box can be provided on top of a crucible support block within the hot zone, and, as such, are in thermal communication with each other so that heat can be conducted from one to the other, preferably by direct thermal contact. The crucible support block can be raised on a plurality of pedestals in order to place the crucible into a central position in the crystal growth apparatus. The crucible support block can be made of any heat resistant material, such as graphite, and is preferably a similar material to the crucible box, if used.

When the crystal growth apparatus is a HEM furnace, a heat exchanger is also employed in the furnace, either alone or in conjunction with insulation configured to be moved relative to a crucible, to control heat extraction. A gas-cooled heat exchanger, for example, a helium-cooled heat exchanger, can be arranged beneath the crucible, to promote solidification of the melted feedstock. Alternatively, a water or liquid-cooled heat exchanger can be used.

The hot zone of the crystal growth apparatus of the present invention also has at least one heating system having multiple heating elements to provide heat to melt a solid feedstock placed in the crucible. The heating elements can be either resistive or inductive in nature. Illustratively, the present invention utilizes resistive heating elements in which current flows through a resistive element which heats up, and the heating element is designed with a particular material, (e.g., graphite, platinum, molybdenum disilicide, silicon carbide, metal alloys such as nickel chromium or iron-chromium-aluminum alloys, etc.).

A preferable embodiment of the present invention promotes uniform heat distribution to feedstock material in a crucible of a crystal growth apparatus by providing a heating system which has at least a first heating element and a second heating element that can provide axisymmetric and symmetric heating to the feedstock material to thereby provide uniform heat distribution to the feedstock material in the crucible to allow for increased consistency in crystal ingot quality.

The illustrative embodiment provides axisymmetric heating by implementing a first heating element that is preferably formed in a circular shape which may be made from a singular piece of material, e.g., graphite. By forming the first heating element out of singular piece of material, resistivity variation is minimized and contact resistance can be reduced, allowing more current can be allowed to pass through the heating element. Additionally, the structural integrity of the element is also strengthened because it is made of a single continuous piece of material, thereby requiring fewer supporting mechanisms within the crystal growth apparatus, as well.

Referring now to the various figures provided herewith wherein like reference characters refer to like parts, there is shown in FIG. 1 an illustrative example of a conventional crystal growth apparatus which may be utilized in combination with the present invention. It should be recognized that the described system is not limiting as it is within the skill of those knowledgeable in the art to adapt other systems to function and operate as described herein.

A crystal growth apparatus 2 is depicted in FIG. 1, as discussed above, can be a furnace for growing ingots from a feedstock material such as silicon. Illustratively, the apparatus 2 is a directional solidification (DSS) furnace which utilizes a directional solidification process to promote crystal growth and directional solidification. Illustratively, a directional solidification block 8 is supported inside the apparatus 2, and configured to receive a crucible 9 containing feedstock material, for example, silicon feedstock material.

A heating system 10 is arranged in the crystal growth apparatus 1, is supported by a plurality of support elements 4 attached to one or more electrodes 6 that are electrically connected to the heating system 10. The support elements 4 incorporate electrically conductive material for electrically connecting the heating element 10 via a circuit, in order to deliver power to the heating system 10 and control operation of the heating system 10.

Previous asymmetric heating systems, like the one illustrated in FIG. 2, include a first heating element 12 and a second heating element 14 that are arranged to form heating system that functions essentially as a single heater. The asymmetric serpentine pattern of the coils in the first heating element and the second heating element, however, do not provide uniform heat/temperature distribution in the crucible to the feedstock material. Rather, the asymmetric serpentine design, as shown in FIG. 2, creates a temperature distribution pattern that is spotty and disproportionate, thus, lacking uniformity across the feedstock material as it is melted. Because of the lack of uniformity, variations in crystal quality tend to occur during ingot formation/solidification.

FIG. 3 shows a perspective view of a heating system 40 according to an exemplary embodiment of the present invention. The heating system 40 includes a first heating element 50, and a second heating element 45. The first heating element 50 is arranged, for example, above a crucible in the crystal growth apparatus so as to provide axisymmetric heat distribution in the direction of a feedstock material in the crucible below. The second heating element 45 is arranged along sides of the crucible so as to substantially enclose the crucible and to provide symmetrical heat distribution to the feedstock material in the crucible. Furthermore, to provide increased heating characteristics, the second heating element 45 may be arranged so as to substantially cover the entire height of an ingot to be formed in the crucible.

One of the noted advantages of the present invention is its geometric symmetry. For example, in panel 49 of FIG. 3, the second heating element 45 is formed in a serpentine pattern so as to be geometrically symmetric with the other four panels of the second heating element 45. By geometrically symmetric it is meant that each section, e.g. sections 43a-c, is substantially the same size and shape as each other section within all four panels of the second heating element 45 as well as each section of panel 49 so as to create a repetitive pattern from section to section and panel to panel. In doing so, the heating element 45 provides symmetric or at least substantially symmetric heat distribution therefrom to the feedstock material in the crucible. In addition, the panels may be connected by a plurality of clips 44 to surround the sides of the crucible so as to form, for example, a square shaped heating element which surrounds all sides of a cubic shaped crucible.

Figure 4:
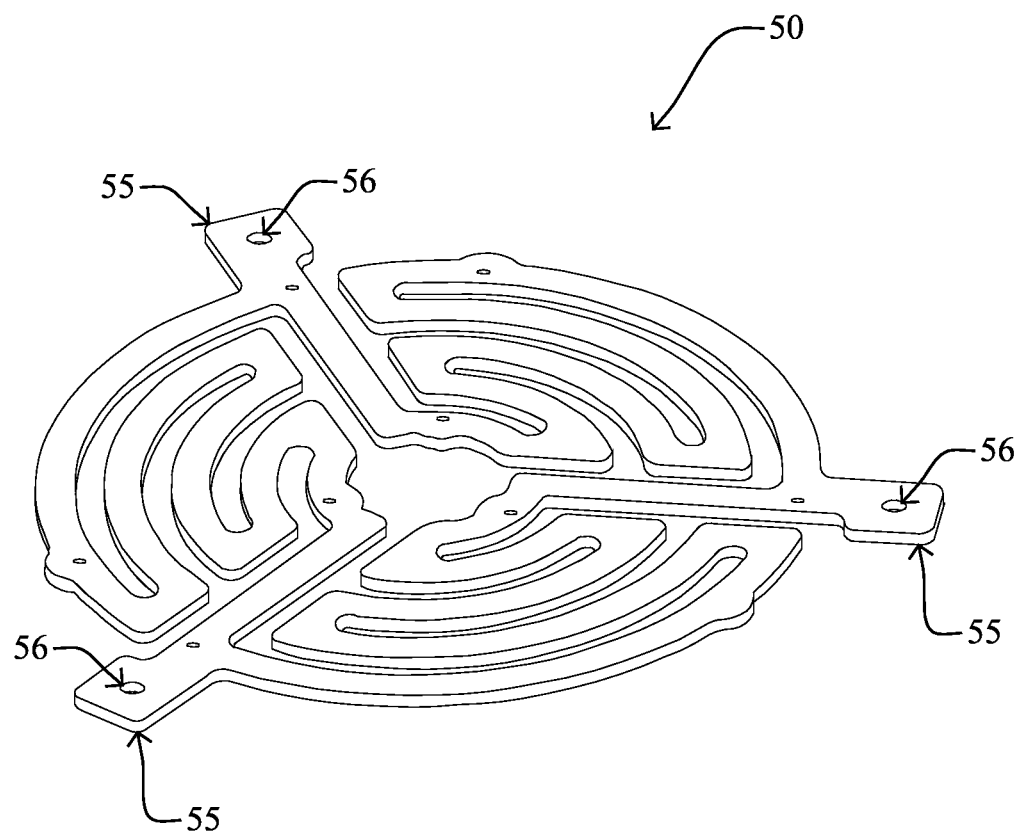
FIG. 4 is an enlarged perspective view of a top/first heating element of FIG. 3.

As can be seen in FIGS. 3 and 4, the exemplary first heating element 50 is also geometrically symmetric, and illustratively formed in a circular shape out of a continuous singular piece of material. It should be noted, however, that although the circular shaped heating element can be made of one singular continuous piece of material, it does not necessarily have to be a solid piece of material. For example, the circular shaped heating element 50 could be a circular serpentine or spiral pattern which is formed within the inner boundaries of the circular shaped heating element.

Furthermore, the circular heating element 50 has a plurality mounting mechanisms 55, also formed of the same continuous singular piece of material as the first heating element protruding out from the circumferential edge of the circular heating element 50. Illustratively, the number of mounting mechanisms 55 in the illustrative embodiment of the present invention correlate directly with the number of electrodes 47a-c which are to be connected/mounted to/with the circular first heating element 50. The mounting mechanisms 55 allow a plurality of electrodes 47a-c to support the first heating element 50 above the crucible within the crystal growth apparatus while at the same time providing an increased contact area for an electrical connection therewith to a power supply and at least one controller. To allow the mounting mechanisms 55 to receive the electrodes, one or more apertures 56 may be formed within the mounting mechanisms 55.

A plurality of electrodes 46a-c and 47a-c illustratively are mounted and electrically connected to both the second heating element 45 and the first heating element 50, which function as both a support mechanism and as an electrical connection for each of the heating elements 50 and 45 independently. In the illustrative embodiment of the present invention, second heating element 45 is shown as having three electrodes mounted thereto in a geometrically symmetric fashion at a first predetermined height so as allow the second heating element 45 to substantially surround and cover a feedstock material, e.g., a silicon feedstock material, in the crucible. Likewise the first heating element 50 is shown as having three electrodes mounted thereto also in a geometrically symmetric fashion at a second predetermined height so as to allow the first heating element 50 to be arranged above a feedstock material in the crucible. However, more than three electrodes or less than three electrodes may be used as will be understood by those skilled in the art.

Preferably, in addition to being geometrically symmetric, the four panels of the second heating element 45 (and in the first heating element 50) are also electrically symmetrical as well. That is, the four panels may be divided electrically into three phases each of which encompass one and one third of a panel evenly. This division can be seen by the three electrodes 46a, b and c (and 47a, b and c) mounted to the second heating element 45 (and the first heating element 50) in a geometrically symmetrical pattern.

Figure 5A:
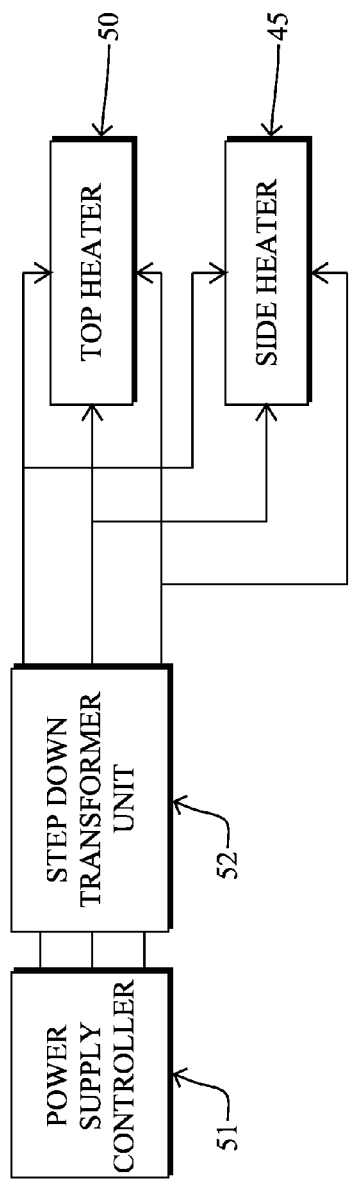
FIGS. 5A, B are schematic drawings of exemplary electrical circuits for controlling heat distribution to feedstock material in the exemplary embodiment of the to present invention.

FIGS. 5A, B are schematic drawings of alternative exemplary electrical circuits for controlling heat/temperature distribution to feedstock material in the exemplary embodiment of the present invention to thereby provide electrically symmetric control to the heating elements 50 and 45, (i.e., top and side heater) respectively. In particular in FIG. 5A, each of the electrodes 46a-c and 47a-c may be individually connected to a step down transformer unit 52 which is connected to a power supply/controller unit 51. The power supply 51 is controlled by at least one controller so that various phases (e.g., three phases) can be applied to the heating elements 45 and 50. For example, if it were advantageous to supply a particular amount of power to a particular heating element 45 for a particular period of time, the at least one controller would control the power supply 51 so as to supply the corresponding power, for instance, to electrodes 47c and 46c for a certain period of time. Additionally, the current flow provided to each of the electrodes respectively can also be controlled to be symmetrically synchronized between the first (top) heating element 50 and the second (side) heating element 45.

Figure 5B:
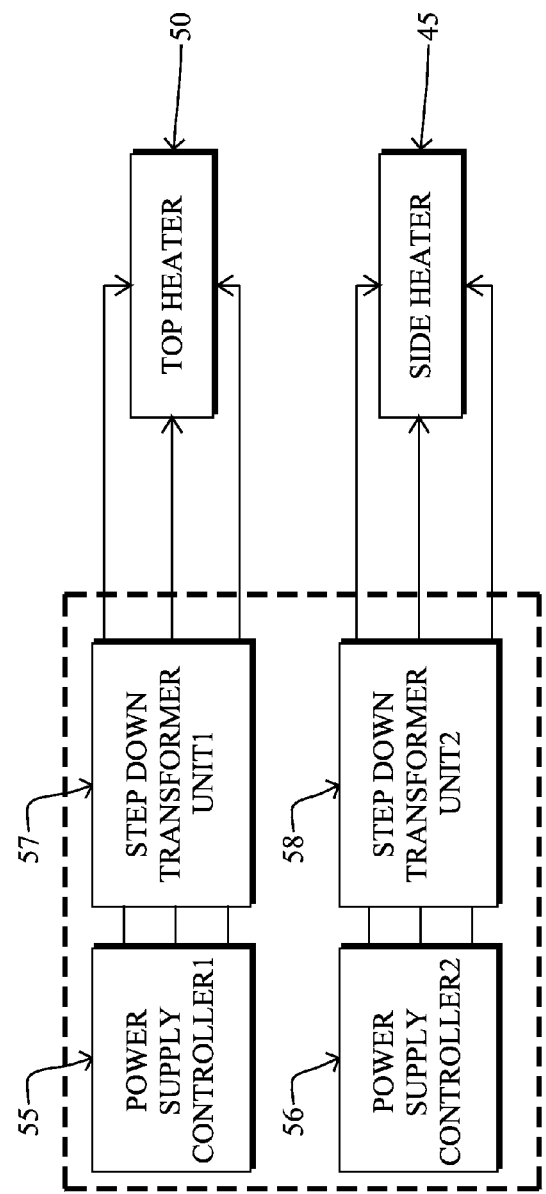

Alternatively, the first heating element (top) 50 and the second heating element (side) 45 may be individually or independently connected to their own power supply controllers 55 and 56 and step down transformers 57, 58, respectively as shown in FIG. 5B. As shown in FIG. 5B, the electrodes of the first heating element are controlled and connected to a power supply controller 55 and a step down transformer unit 57. While likewise, the second heating element (side) 45 is controlled and connected to a power supply controller 56 and a step down transformer unit 58. As will be understood by those skilled in the art, the circuits provided are merely examples, and can be configured in any many which would provide for efficient and effective control of the heating elements 45 and 50 during ingot to formation.

That is, the first heating element 50 and the second heating element 45 may be connected to and operated by one or more power supply controllers via a parallel circuit. As a means for controlling the power/current supplied to the first heating element 50 and the second heating element 45, the power supply controller may be incorporated into the circuit to independently or dependently control the current supplied to each of the heating elements respectively. For example, in some embodiments of the present invention the current flowing through the first and the second heating elements or vice versa, respectively may be proportioned in a range of about 40:60 to 60:40 or in any other range beneficial to ingot formation/solidification, e.g., a 0:100 ratio a 30:70 ratio, a 70:30 ratio, 100:0, etc. In other embodiments of the present invention, the current flowing to the first heating element 50 may be a predetermined percentage higher than that flowing to second heating element 45 or vice versa depending upon particular thermal distribution requirements in the crucible at that particular point in time.

Thus, the present invention may also utilize a non-transitory computer readable medium which contains executable program instructions executed by a processor within at least one controller in the circuit to control power supplied to a heating system in a crystal growth apparatus. That is, the control mechanisms of the present invention may be embodied as computer readable media on a computer readable medium containing executable program instructions executed by a processor embodied in a controller. Examples of the computer readable mediums include, but are not limited to, ROM, RAM, compact disc (CD)-ROMs, magnetic tapes, floppy disks, and optical data storage devices. The computer readable recording medium can also be distributed in network coupled computer systems so that the computer readable media is stored and executed in a distributed fashion.

Furthermore, it is noted that although these electrodes 46a-c and 47 a-c are shown as being connected in parallel, it is also possible to connect them in series as while without departing from the overall concept of the illustrative embodiment of the present invention.

Figures 6A, 6B, 6C:
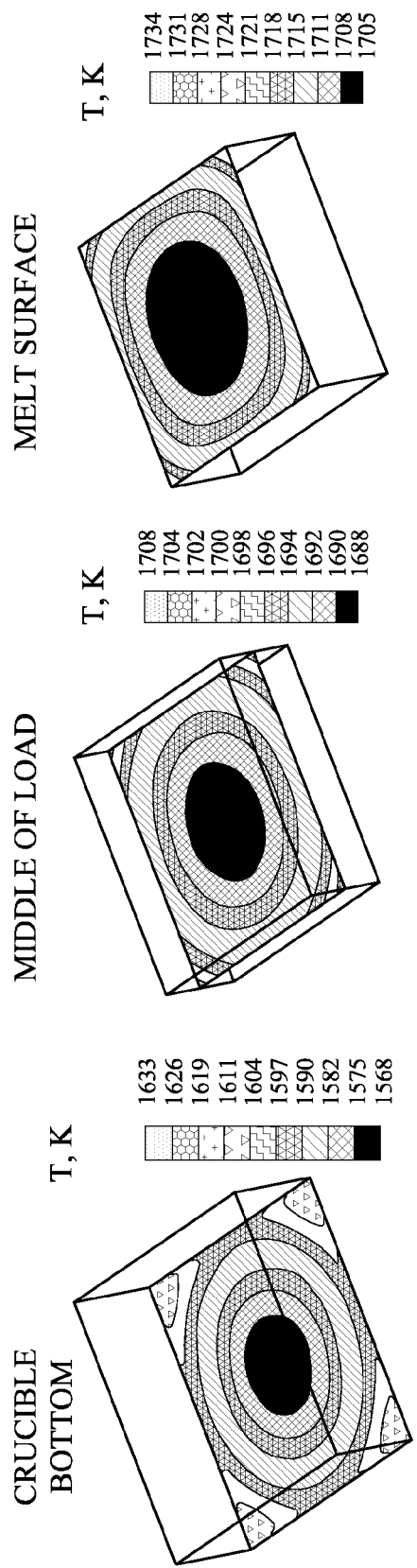
FIG. 6(A)-(C) are graphical illustrations of resulting thermal distributions of the presently designed heating elements of FIGS. 3 and 4.

Referring back to FIG. 3, the first heating element 50 is arranged above the crucible in the crystal growth apparatus. Due to the design of the first and second heating elements 45 and 50, the heat/temperature distributed from the first heating to element 50 is axisymmetrically distributed to the top of the feedstock material in the crucible. FIGS. 6A, B, and C show experimental results of heat/temperature distribution across three cross-sections areas (i.e., bottom, middle and top) of the feedstock material during a typical melting process while utilizing the present invention. As can be seen from the results, most of the temperature distribution across the surface of the silicon feedstock material is substantially axisymmetrical in nature.

As stated above, while dual heating elements can be used to form larger ingots, the use of multiple components adds to the complexity of the solidification system and makes it difficult to control heat flow and distribution precisely, especially in a production environment. It is desirable, particularly in applications for growing large ingots, to provide multiple heating elements that are capable of achieving substantially even heating of the entire feedstock material contained in the crucible and adequately control heat flow and distribution throughout the furnace hot zone. Therefore, it would be desirable to design a heating system which could provide uniform heat distribution to the feedstock-containing crucible to thereby provide for more consistent crystal quality.

Advantageously, the illustrative embodiment of the present invention provides a heating system which is able to provide uniform heat distribution to a feedstock material in a crucible of a crystal growth apparatus. Additionally, since the first heating element is made completely from a singular piece of material (including its mounting mechanisms), an increase current efficiency or flow can be achieved in comparison to previous designs. Furthermore, since the second heating element is geometrically symmetrical as well as electrically symmetrical, even further control over the solidification process of silicon ingots in a crystal growth apparatus can be realized.

Although preferred embodiments of the invention have been described using specific terms, such description is for illustrative purposes only, and it is to be understood that changes and variations may be made without departing from the spirit or scope of the following claims.

The invention claimed is:
1. A crystal growth apparatus, comprising:
   a feedstock material received in a crucible having a cuboid shape, the crucible arranged in the crystal growth apparatus; and
   a heating system arranged in the crystal growth apparatus, the heating system comprising at least a first heating element and a second heating element, the first heating element being circular and configured to distribute heat axisymmetrically to the feedstock material and the second heating element being square-shaped and configured to distribute heat symmetrically to the feedstock material, wherein the circular first heating element is arranged above the cuboidal crucible and the square- shaped second heating element is arranged along all sides of the cuboidal crucible.

2. The crystal growth apparatus of claim 1, wherein the first heating element is formed out of a single piece of material.

3. The crystal growth apparatus of claim 1, wherein the second heating element is formed in a serpentine shape.

4. The crystal growth apparatus of claim 1, wherein the first heating element and the second element are independently controlled by a controller connected to electrodes mounted and connected to the first and second heating elements of the crystal growth apparatus.

5. The crystal growth apparatus of claim 4, wherein the first heating element and the second heating element are connected to and are operated by a single power supply through a plurality of electrodes.

6. The crystal growth apparatus of claim 4, wherein current flowing between the first heating element and the second heating element is in a range of 40:60 to 60:40.

7. The crystal growth apparatus of claim 1, wherein the second heating element is arranged so as to substantially cover the entire height of an ingot in the crucible.

8. A method for heating a feedstock material in a crystal growth apparatus, comprising:

receiving the feedstock material in a crucible having a cuboid shape, the crucible arranged in the crystal growth apparatus; and operating a heating system, by a controller, to heat and melt the feedstock material in the crucible, the heating system heating the feedstock material via at least a first heating element, the first heating element being circular and distributing heat axisymmetrically to the feedstock material and the second heating element being square shaped and distributing heat symmetrically to the feedstock material, wherein the circular first heating element is arranged above the cuboidal crucible and the square shaped second heating element is arranged along all sides of the cuboidal crucible.

9. The method of claim 8, wherein the second heating element is formed in a serpentine shape to distribute heat symmetrically to the feedstock material from each side of the crucible.

10. The method of claim 8, further comprising operating the first heating element independently of the second heating element.

\* \* \* \* \*